United States Patent [19]

Cuneo, Jr. et al.

[11] 4,419,622

[45] Dec. 6, 1983

[54] EM SENSOR FOR DETERMINING IMPEDANCE OF EM FIELD

[75] Inventors: Andrew A. Cuneo, Jr., Towson, Md.; James J. Loftus, Alex, Va.

[73] Assignee: The United States of America as represented by the Secretary of the Army, Washington, D.C.

[21] Appl. No.: 275,470

[22] Filed: Jun. 19, 1981

[51] Int. Cl.³ .............................................. G01R 27/00
[52] U.S. Cl. .................... 324/57 R; 455/226
[58] Field of Search ................ 324/57 R, 58 R, 350, 324/344; 455/226, 67, 123

[56] References Cited

U.S. PATENT DOCUMENTS

| | | | |
|---|---|---|---|
| 3,087,111 | 4/1963 | Lehan et al. | 324/344 |
| 3,422,345 | 1/1969 | Muse | 324/350 |
| 3,594,633 | 7/1971 | Barringer | 324/344 X |
| 3,986,207 | 10/1976 | Gerbel et al. | 324/350 X |
| 4,031,469 | 6/1977 | Johnson | 455/226 |

*Primary Examiner*—Stanley T. Krawczewicz
*Attorney, Agent, or Firm*—Robert P. Gibson; Anthony T. Lane; Saul Elbaum

[57] ABSTRACT

A method and device for determining the impedance of the electric and magnetic fields in the near and far fields associated with a radiating antenna. The electric and magnetic field components are sensed in a far field location and the system is calibrated using a known relationship between the electric and magnetic field components. The sensed signals are transmitted optically via a fiber optic link to an optical receiver. The received optical signals are modulated by an audio signal generator and input into a ratio detector via variable attenuators which are used to calibrate the system. Multiple subsequent ratios are measured and recorded as a function of location of the sensor.

18 Claims, 2 Drawing Figures

EM SENSOR FOR DETERMINING IMPEDANCE OF EM FIELD

RIGHTS OF THE GOVERNMENT

The invention described herein may be manufactured, used or licensed by or for the Government of the United States of America for governmental purposes without payment to us of any royalties thereof.

BACKGROUND OF THE INVENTION

This invention relates generally to the measurement of the ratio of electric and magnetic field components from a vertical antenna situated near the air-ground interface. More specifically this invention relates to a method and device which eliminates the need for having electric and magnetic field sensors with known calibration factors. In many engineering and applied science applications in electromagnetics it is desirable to be able to determine the location where the ratio of the field components E and H begins to deviate from 377 ohms. The present invention provides a relatively simple method and device for determining this impedance relationship. The device can be self-calibrated so that the impedance of the field components is the direct output of the device thus negating the need for further processing of the data as required in other devices. The device is self-calibrated using the known relationship between the electric and magnetic fields.

It is therefore one object of this invention to provide a device for determining the impedance of the electric and magnetic fields of a radiating antenna that can be self-calibrated.

It is another object of this invention to provide a device for determining the impedance of the electric and magnetic fields of a radiating antenna that directly outputs the impedance of the field components without further data processing being required.

It is a further object of this invention to provide a device for determining the impedance of the electric fields of a radiating antenna that is simple and inexpensive.

It is still another object of this invention to provide a method for determining the impedance of the electric and magnetic fields of a radiating antenna that utilizes a known relationship between the electric and magnetic fields to self-calibrate the measuring system.

It is still another object of this invention to provide a method for determining the impedance of the electric and magnetic fields of a radiating antenna that provides a direct readout of the impedance of the field components.

Other objects, advantages and novel features of the present invention will become apparent from the following detailed description of the invention when considered in conjunction with the accompanying drawings.

SUMMARY OF THE INVENTION

These and other objects, features and advantages of the invention are accomplished by a method and device that determines the impedance of the electric and magnetic fields in the near and far fields associated with a radiating antenna by sensing the electric and magnetic field components at a location in the far field of the antenna wherein the device is calibrated using a known relationship between the electric and magnetic field components. The electric and magnetic field components are then sensed at multiple subsequent locations both within and without the near field of the antenna. The electric and magnetic field components are individually attenuated and transformed into optical signals and transmitted via fiber optic links to optical receivers. The received optical signals are transformed into radio frequency signals, modulated and input into a ratio detector. The calibration of the system is accomplished by adjusting the modulated radio frequency signals obtained at the first location in the far field until the ratio detector indicates a ratio of one. The output of the ratio detector is recorded as a function of location for each subsequent location. The recorder is calibrated to record directly the desired quantities.

BRIEF DESCRIPTION OF THE DRAWINGS

The above and further objects and novel features of the invention will more fully appear from the following description when the same is read in connection with the accompanying drawings. It is to be understood, however, that the drawings are for the purpose of demonstration only, and are not intended as a definition of the limits of the invention.

DESCRIPTION OF THE PREFERRED EMBODIMENT

Figure 1:
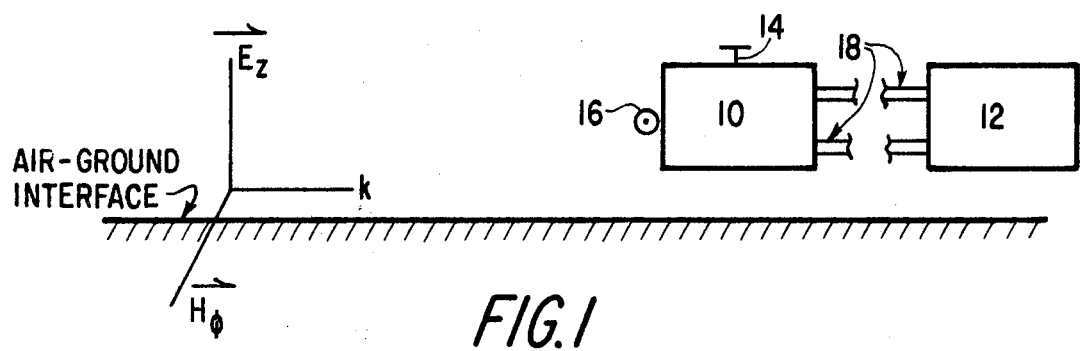
FIG. 1 illustrates the relationship between the electric and magnetic field sensors and the electric and magnetic field components.
Figure 2:
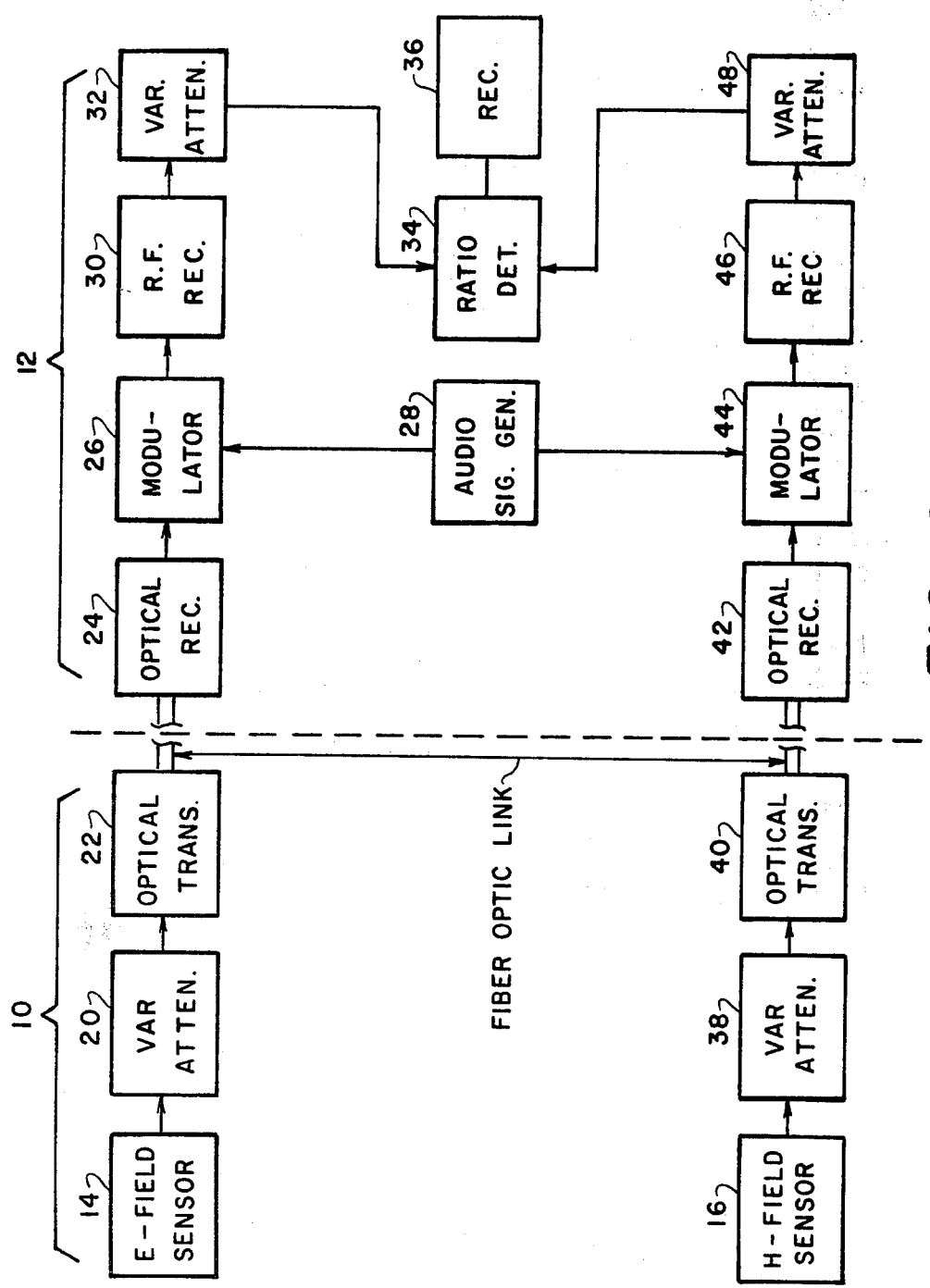
FIG. 2 is a schematic of the present invention.

Referring now to the drawings, wherein like reference characters designate like or corresponding parts throughout the several views, FIG. 1 illustrates the relationship between the electric and magnetic field components and the electric and magnetic field sensors and FIG. 2 is a schematic of the components of the present invention. The electromagnetic sensor of the present invention is divided into a sensor portion 10 and a receiver-recorder portion 12. An E-Field sensor 14 and an H-Field sensor 16 are orthogonally mounted on the sensor portion 10 which is made of a metallic material to shield the components within from external electromagnetic fields. The sensor portion 10 is linked to the receiver portion 12 by fiber optics 18 to preclude electromagnetic fields from interferring with the signals transmitted therethrough.

If the transmitting antenna (not shown) is on the ground and the sensor 10 is located near the air-ground interface the predominant components at the interface are the electric field component $E_z$ and the magnetic field component $H_\phi$, reference G. Tyras, "Radiation and Propagation of Electromagnetic Waves," Academic Press, 1969 pages 150–151. At sufficiently large distances from the transmitting antenna, which is a dipole and is assumed to be at the air-ground interface, the predominant field components are given by $$E_z = k_o^2 \pi_1$$

$$H_\phi = -\omega\epsilon_o k_o \pi_1$$

where $\pi_1$ is the Hertzian vector. The ratio of $E_z$ to $H_\phi$ is then $$\frac{E_z}{H_\phi} = \frac{k_o^2 \pi_1}{-\omega \epsilon_o k_o \pi_1}$$

$$\left|\frac{E_z}{H_\phi}\right| = \frac{k_o}{\omega\epsilon_o} = \frac{\omega/c}{\omega\epsilon_o} = \frac{1}{c\epsilon_o} = \frac{1}{1/\sqrt{\mu_o\epsilon_o}\,\epsilon_o} =$$

$$\frac{1}{\sqrt{\epsilon_o}/\sqrt{\mu_o}} = \sqrt{\frac{\mu_o}{\epsilon_o}} = 377 \text{ ohms}$$

Referring now to FIG. 2 the continuous wave (CW) output of the E-Field sensor 14 is input into a variable attenuator 20 which is used to bring the signal within the dynamic range of the system. The attenuated E-Field signal is transformed into an optical signal by the optical transmitter 22 and transmitted by a fiber optic link 18 to an optical receiver 24. The optical system is used to provide isolation between the sensor and the remainder of the instrumentation. The output of the optical receiver 24 is modulated in modulator 26 by an audio signal from audio signal generator 28. This modulated signal is input into RF receiver 30. The output of the RF receiver 30 is an audio signal used as one input to ratio detector 34 after being fed through attenuator 32. Similarly, the H-Field component is sensed by H-Field sensor 16 fed through variable attenuator 38 to optical transmitter 40. The H-Field signal is transmitted by fiber optic link 18 to optical receiver 42, modulated by modulator 44 by an audio signal from audio signal generator 28, input to RF receiver 46 and fed through variable attenuator 48 to ratio detector 34 wherein the H-Field signal comprises the second input to ratio detector 34. The components described above are standard off-the-shelf components. The variable attenuators 32 and 48 are used to balance the two inputs to the ratio detector 34. The output of ratio detector 34 is proportional to the ratio of the E-Field signal to the H-Field signal and is recorded by recorder 36 where the impedance is plotted as a function of location of the sensor.

The operation of the system is initiated by placing the sensor portion 10 far enough away from the radiating antenna to ensure that the ratio of the electric field to the magnetic field is equal to 377 ohms. This distance varies for each antenna but those of ordinary skill in the art can easily determine a distance wherein the ratio is equal to 377 ohms, i.e., the far field of the antenna. The sensor portion 10 is oriented so the E-Field sensor 16 will couple directly to the predominant components of the radiating field. The variable attenuators 32 and 48 are adjusted to where the output of ratio detector 34 is equal to one. The attenuators 32 and 48 are then fixed and the sensor portion 10 is moved towards the radiating antenna while maintaining the proper orientation of sensors 14 and 16. The output of ratio detector 34 will remain equal to one until the sensor portion 10 enters the near field at which time the ratio of the E-Field signal to the H-Field signal will begin to deviate from one (the absolute value begins to deviate from 377 ohms). The output of ratio detector 34 changes in direct proportion to the absolute ratio of the field components of E and H. The recorder 36 can be calibrated so that the output reading indicates the impedance values directly.

The unique technique of calibrating the system in the far field eliminates the requirement for having electric and magnetic field sensors with known calibration factors. The present invention provides a method and device that is relatively simple and inexpensive to rapidly and accurately determine the near field-far field interface of a radiating antenna.

While the invention has been described with reference to the accompanying drawings, it is to be clearly understood that the invention is not to be limited to the particular details shown therein as obvious modifications may be made by those skilled in the art. The embodiments of the invention should only be construed with the scope of the following claims.

What we claim is:

1. A method of determining the impedance of the electric and magnetic fields in the near and far fields associated with a radiating antenna comprising the steps of:
   sensing said electric and magnetic field components of said antenna at a first location in said far field;
   sensing electric and magnetic field components of said antenna at multiple subsequent locations;
   transforming each of said electric and magnetic field components into an optical electric field signal and an optical magnetic field signal;
   transmitting each of said optical signals to optical signal receivers;
   transforming each of said optical siganls into a radio frequency electric field signal and a radio frequency magnetic field signal;
   modulating said radio frequency electric field and radio frequency magnetic field signals;
   determining a ratio between said modulated radio frequency electric and magnetic field siganls;
   recording said ratio as a function of said first and subsequent locations.

2. A method, as recited in claim 1,
   further comprising the step of calibrating said modulated radio frequency electric and magnetic field signals wherein said ratio between the modulated radio frequency electric field signal and the modulated radio frequency magnetic field is one.

3. A method, as recited in claim 2, wherein the step of sensing said electric and magnetic field components of said antenna at multiple subsequent locations is accomplished in the near field of said antenna.

4. A method, as recited in claim 3:
   wherein the step of modulating said radio frequency electric and magnetic field signals is accomplished by modulating said radio frequency signals with an audio frequency; and
   further comprising the step of extracting an audio frequency electric field signal and an audio frequency magnetic field signal.

5. A method, as recited in claim 4, wherein the step of determining a ratio is accomplished by inputing said audio frequency electric field signal and said audio frequency magnetic field signal into a ratio detector.

6. A method, as recited in claim 5, wherein the step of calibrating said modulated radio frequency electric and magnetic field signals wherein said ratio is one is accomplished by varying the input to the ratio detector.

7. A method, as recited in claim 6, further comprising the step of attenuating the sensed field components.

8. A method, as recited in claim 7, wherein the step of transmitting each of said optical signals is accomplished via fiber optics.

9. A method, as recited in claim 1, wherein said recording step comprises the step of recording the value of said impedance directly.

10. A device for determining the impedance of the electric and magnetic fields in the near and far fields associated with a radiating antenna comprising:
    means for sensing said electric and magnetic field components of said antenna at a first location in said far field and at multiple subsequent locations;
    means for transforming each of said electric and magnetic field components into optical signals,
    means for transmitting said optical signals to said optical receivers;
    means for transforming said optical signals into radio frequency signals;
    means for modulating said radio frequency signals;
    means for determining a ratio between said modulated radio frequency signals; and
    means for recording said ratio as a function of said first and subsequent locations.

11. A device, as recited in claim 10:
    wherein said first location is in the far field; and
    further comprising means for calibrating said means for determining a ratio wherein said ratio is one.

12. A device, as recited in claim 11, wherein said multiple subsequent locations are in the near field of said antenna.

13. A device, as recited in claim 12:
    wherein said means for modulating said radio frequency signals comprises a modulator with an audio frequency input; and
    further comprising means for extracting and inputing the audio frequency modulation into said means for determining a ratio.

14. A device, as recited in claim 13, wherein the means for determining a ratio comprises a ratio detector.

15. A device, as recited in claim 14, wherein said means for calibrating said means for determining a ratio comprises means for varying said modulated radio frequency signals input to said ratio detector.

16. A device, as recited in claim 14, further comprising means for attenuating said sensed field components.

17. A device, as recited in claim 15, wherein said means for transmitting said optical signals comprise fiber optics.

18. A device, as recited in claim 9, further comprising means for calibrating said recording means to indicate the value of said impedance directly.

* * * * *